(12) United States Patent
Coolbaugh et al.

(10) Patent No.: US 7,214,593 B2
(45) Date of Patent: May 8, 2007

(54) PASSIVATION FOR IMPROVED BIPOLAR YIELD

(75) Inventors: Douglas Duane Coolbaugh, Essex Junction, VT (US); Peter B. Gray, Essex, VT (US); Donna Kaye Johnson, Underhill, VT (US); Michael Joseph Zierak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 667 days.

(21) Appl. No.: 09/773,798

(22) Filed: Feb. 1, 2001

(65) Prior Publication Data

US 2002/0102787 A1   Aug. 1, 2002

(51) Int. Cl.
*H01L 21/331* (2006.01)
*H01L 21/8222* (2006.01)

(52) U.S. Cl. ............... 438/318; 257/197; 257/E29.033

(58) Field of Classification Search ............... 257/649, 257/192, 197, 289, 370, 410, 411, 616, 584, 257/587, 593, 592, 586, 198; 438/312, 348, 438/320, 314, 364, 235, 309, 317, 318
See application file for complete search history.

(56) References Cited

U.S. PATENT DOCUMENTS

| | | | |
|---|---|---|---|
| 4,691,219 A | 9/1987 | Goth | |
| 4,757,027 A * | 7/1988 | Vora | 437/39 |
| 4,871,684 A | 10/1989 | Glang et al. | |
| 4,929,570 A | 5/1990 | Howell | |
| 4,987,102 A * | 1/1991 | Nguyen et al. | 437/238 |
| 5,067,002 A | 11/1991 | Zdebel et al. | |
| 5,106,767 A | 4/1992 | Comfort et al. | |
| 5,121,184 A | 6/1992 | Huang et al. | |
| 5,162,255 A | 11/1992 | Ito et al. | |
| 5,177,567 A * | 1/1993 | Klersy et al. | 257/4 |
| 5,286,661 A | 2/1994 | de Fresart et al. | |
| 5,323,032 A | 6/1994 | Sato et al. | |
| 5,331,199 A | 7/1994 | Chu et al. | |
| 5,336,625 A | 8/1994 | Tong | |

(Continued)

FOREIGN PATENT DOCUMENTS

JP   406151829 A  *  5/1994

OTHER PUBLICATIONS

Adel S. Sedra, Kenneth C. Smith, Microelectronic Circuits 1998, Oxford University Press, Inc., Fourth Edition, p. 223.*

(Continued)

*Primary Examiner*—B. William Baumeister
*Assistant Examiner*—Dana Farahani
(74) *Attorney, Agent, or Firm*—Scully, Scott, Murphy & Presser, P.C.; William D. Sabo, Esq.

(57) ABSTRACT

A SiGe heterojunction bipolar transistor including at least an emitter formed on a SiGe base region wherein the sidewalls of the emitter are protected by a conformal passivation layer. The conformal passivation layer is formed on the exposed sidewalls of said emitter prior to siliciding the structure. The presence of the passivation layer in the structure prevents silicide shorts from occurring by eliminating bridging between adjacent silicide regions; therefore improved SiGe bipolar yield is obtained. A method for forming such a structure is also provided.

18 Claims, 4 Drawing Sheets

U.S. PATENT DOCUMENTS

| | | | |
|---|---|---|---|
| 5,374,566 A | | 12/1994 | Iranmanesh |
| 5,399,511 A | * | 3/1995 | Taka et al. .................... 437/31 |
| 5,504,018 A | | 4/1996 | Sato |
| 5,614,758 A | | 3/1997 | Hérbert |
| 5,620,907 A | * | 4/1997 | Jalali-Farahani et al. ... 438/320 |
| 5,661,046 A | | 8/1997 | Ilderem et al. |
| 5,773,350 A | | 6/1998 | Herbert et al. |
| 5,897,359 A | | 4/1999 | Cho et al. |
| 5,939,738 A | | 8/1999 | Morris |
| 5,953,600 A | | 9/1999 | Gris |
| 5,963,789 A | * | 10/1999 | Tsuchiaki .................... 438/62 |
| 6,040,225 A | | 3/2000 | Boles |
| 6,169,007 B1 | * | 1/2001 | Pinter ........................ 438/320 |
| 6,268,779 B1 | * | 7/2001 | Van Zeijl .................... 331/117 |
| 6,319,775 B1 | * | 11/2001 | Halliyal et al. ............. 438/261 |
| 6,326,652 B1 | * | 12/2001 | Rhodes ...................... 257/231 |
| 6,331,492 B2 | * | 12/2001 | Misium et al. ............. 438/762 |

OTHER PUBLICATIONS

Adel S. Sedra, Kenneth C. Smith, Microelectronic Circuits 1998, Oxford University Press, Inc., Fourth Edition, p. A-8.*

* cited by examiner

PASSIVATION FOR IMPROVED BIPOLAR YIELD

FIELD OF THE INVENTION

The present invention relates to heterojunction bipolar transistors, and more particularly to a method of fabricating a SiGe heterojunction bipolar transistor in which the SiGe bipolar yield is improved by protecting the edges, i.e., sidewalls, of the bipolar emitter with a passivation layer prior to siliciding the silicon surfaces of the bipolar transistor.

BACKGROUND OF THE INVENTION

Significant growth in both high-frequency wired and wireless markets has introduced new opportunities where compound semiconductors such as SiGe have unique advantages over bulk complementary metal oxide semiconductor (CMOS) technology. With the rapid advancement of epitaxial-layer pseudomorphic SiGe deposition processes, epitaxial-base SiGe heterojunction bipolar transistors have been integrated with mainstream advanced CMOS development for wide market acceptance, providing the advantages of SiGe technology for analog and RF circuitry while maintaining the full utilization of the advanced CMOS technology base for digital logic circuitry.

A typical prior art SiGe heterojunction bipolar transistor is shown, for example, in FIG. 1. Specifically, the SiGe heterojunction bipolar transistor shown in FIG. 1 comprises semiconductor substrate 10 of a first conductivity type having sub-collector 14 and collector 16 formed therein. Isolation regions 12, which are also present in the substrate, define the outer boundaries of the bipolar transistor. The bipolar transistor of FIG. 1 further includes SiGe layer 20 formed on a surface of substrate 10 as well as isolation regions 12. The SiGe layer includes polycrystalline Si regions 24 that are formed over the isolation regions and SiGe base region 22 that is formed over the collector and subcollector regions. The prior art bipolar transistor also includes patterned insulator layer 26 formed on the base region and emitter 28 formed on the patterned insulator layer as well as a surface of SiGe base region 22. Silicide regions 30 are also present in the structure shown in FIG. 1.

A major problem with the prior art SiGe heterojunction bipolar transistors of the type illustrated in FIG. 1 is that the SiGe bipolar yield is significantly reduced because of the presence of shorts which are introduced into the structure during the silicide process. The shorts are caused by the presence of silicide bridges that exist in the structure. As such, a 20–30% yield loss is typically associated with prior art SiGe heterojunction bipolar transistors. The SiGe bipolar yield loss is more pronounced when cobalt disilicide regions are formed in the structure.

In view of the above mentioned problem with prior art heterojunction bipolar transistors, there is still a continued need for developing a new and improved method which is capable of fabricating a heterojunction bipolar transistor in which the SiGe bipolar yield loss due to silicide shorts has been substantially eliminated.

SUMMARY OF THE INVENTION

One object of the present invention is to provide a method of fabricating a SiGe heterojunction bipolar transistor wherein improved SiGe bipolar yield is achieved.

Another object of the present invention is to provide a method of fabricating a SiGe heterojunction bipolar transistor wherein the shorts caused during the formation of silicide regions in the structure are substantially eliminated.

A further object of the present invention is to provide a method of fabricating a SiGe heterojunction bipolar transistor which prevents bridging between adjacent silicide regions.

An even further object of the present invention is to provide a method of fabricating a SiGe heterojunction bipolar transistor using processing steps that are compatible with existing bipolar and CMOS (complementary metal oxide semiconductor) processing steps.

These and other objects and advantages are achieved in the present invention by protecting the edges of the emitter with a passivation layer prior to the formation of silicide regions in the structure. The passivation layer is formed on the edges of the emitter in the present invention by utilizing a rapid thermal chemical vapor deposition (RTCVD) process which is capable of providing a conformal layer thereon. The passivation layer employed in the present invention may be composed of a nitride an oxide, an oxynitride or any combination thereof.

Specifically, the method of the present invention comprises the steps of:

(a) forming a passivation layer on at least exposed sidewalls of an emitter, said emitter is in contact with an underlying SiGe base region through an emitter opening formed in an insulator layer; and (b) siliciding any exposed silicon surfaces so as to form silicide regions therein.

In accordance with the present invention, the passivation layer is formed from a rapid thermal chemical vapor deposition process which is capable of forming a conformal layer of passivating material on the sidewalls of the emitter. The passivating layer employed in the present invention may be composed of a nitride, an oxide, an oxynitride or any combination thereof. Of these passivating materials, it is highly preferred in the present invention that the passivation layer be composed of a nitride.

Another aspect of the present invention relates to the SiGe heterojunction bipolar transistor that is fabricated from the above-mentioned processing steps. Specifically, the inventive SiGe heterojunction bipolar transistor comprises:

a semiconductor substrate having a collector and subcollector region formed therein, wherein said collector is formed between isolation regions that are also present in the substrate;

a SiGe layer formed on said substrate, said SiGe layer including polycrystalline Si regions formed above said isolation regions and a SiGe base region formed above said collector and subcollector regions;

a patterned insulator layer formed on said SiGe base region, said patterned insulator layer having an opening therein;

an emitter formed on said patterned insulator layer and in contact with said SiGe base region through said opening, said emitter having exposed sidewalls;

a conformal passivation layer formed on at least said exposed sidewalls of said emitter; and silicide regions formed on exposed portions of said SiGe layer and said emitter not covered by said conformal passivation layer.

It is emphasized that the passivation layer is employed in the present invention as a means for preventing bridging between adjacent silicide regions which, if present in the structure, causes silicide shorts.

DETAILED DISCUSSION OF THE INVENTION

Figure 1:
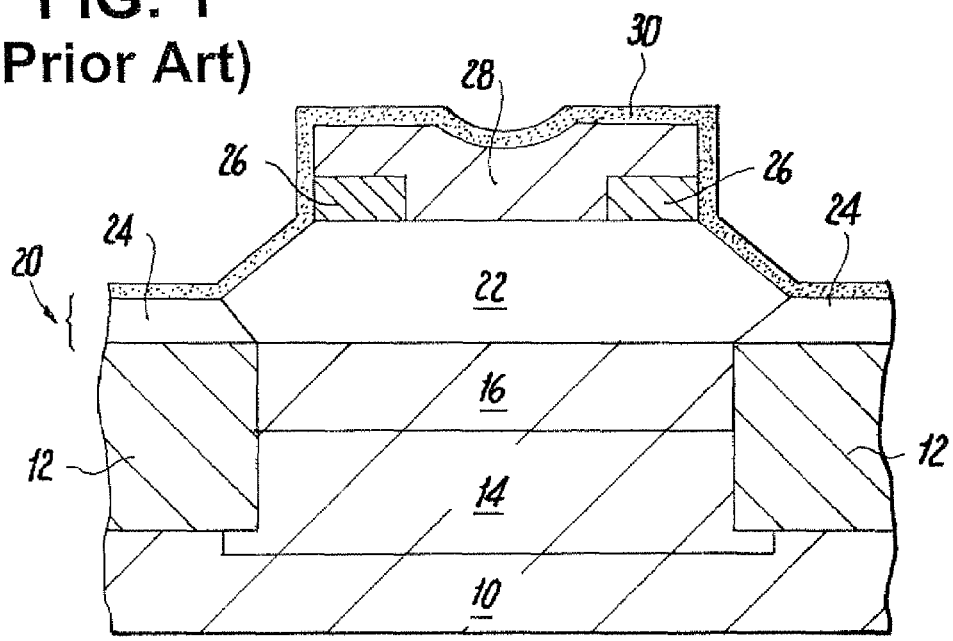
FIG. 1 is a pictorial representation of a prior art SiGe heterojunction bipolar transistor which does not include the passivation layer of the present invention formed on any exposed sidewalls of the emitter.

The present invention which provides a method for improving the SiGe bipolar yield of a SiGe bipolar transistor as well as a SiGe heterojunction bipolar transistor will now be described in more detail by referring to the drawings the accompany the present invention. It is noted that in the accompanying drawings, like and corresponding elements are referred to by like reference numerals. Also, for simplicity, only one bipolar device region is shown in the drawings. Other bipolar device regions as well as digital logic circuitry may be formed adjacent to the bipolar device region depicted in the drawings.

Figure 2:
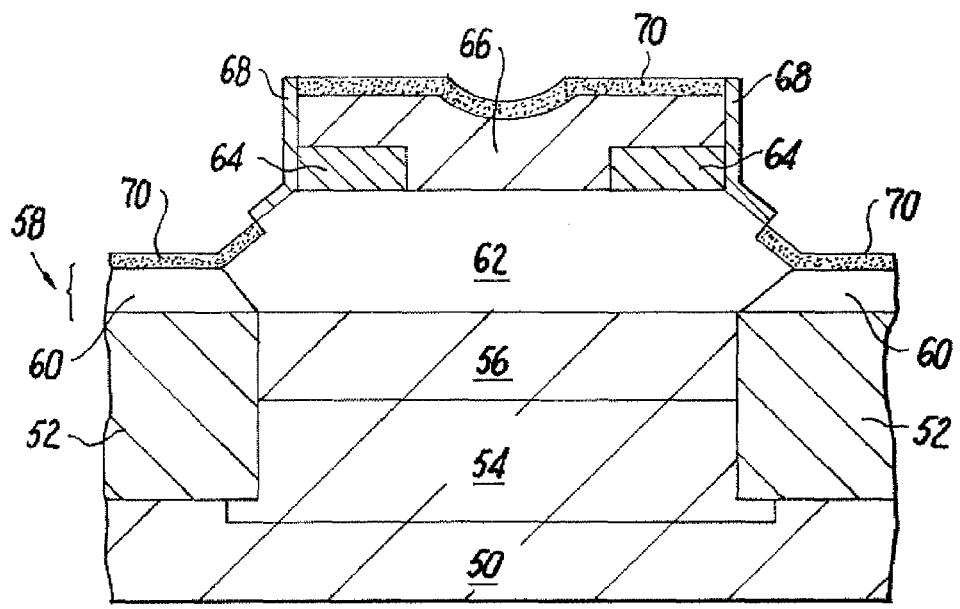
FIG. 2 is a pictorial representation of the inventive SiGe heterojunction bipolar transistor which includes a conformal passivation layer formed on exposed sidewalls of the emitter.

Reference is first made to FIG. 2 which represents a cross-sectional view of the inventive SiGe heterojunction bipolar transistor. Specifically, the SiGe heterojunction bipolar transistor comprises semiconductor substrate 50 of a first conductivity type (N or P) having sub-collector region 54 and collector region 56 formed therein. Isolation regions 52 which are also present in the substrate define the outer boundaries of the bipolar device region and serve to isolate the bipolar device region shown in FIG. 2 from adjacent device regions.

The SiGe bipolar transistor of FIG. 2 also includes SiGe layer 58 formed on substrate 50 as well as isolation regions 52. In accordance with the present invention, the SiGe layer includes polycrystalline Si regions 60 that are formed over isolation regions 52 and SiGe base region 62 which is formed over the collector and subcollector regions. The SiGe base region includes extrinsic base and intrinsic regions; these regions are not separately labeled in the drawings, but are nevertheless meant to be included within region 62. It is noted that the extrinsic and intrinsic base regions of the structure are sometimes referred to as the pedestal portion of a bipolar transistor device.

The bipolar transistor of FIG. 2 also comprises a patterned insulator layer 64 which has an opening formed therein and an emitter, i.e., a region of intrinsic polysilicon, 66 formed on said patterned insulator layer and in,contact with the SiGe base region through the opening in the patterned insulator layer. The inventive bipolar transistor shown in FIG. 2 also includes conformal passivation layer 68 which is present on the exposed sidewalls of emitter 66; conformal passivation layer 68 may also be present on sidewalls of the patterned insulator as well as on a portion of the SiGe base region. Silicide regions 70 are also shown in the inventive bipolar transistor. The silicide regions are formed on the horizontal portion of the emitter as well as exposed portions of SiGe layer 58.

It is noted that the bipolar transistor shown in FIG. 2 has improved SiGe bipolar yield because of the presence of the passivation layer which is formed in the structure prior to forming the silicide regions. The passivation layer prevents bridging between adjacent silicide regions which typically occurs in prior art SiGe heterojunction bipolar transistors. See FIG. 1 In the present invention, bipolar yield may be improved as much as 20 to 30%; therefore the present invention provides an improved structure compared with prior art SiGe bipolar transistors which do not contain the passivation layer therein.

Figure 3:
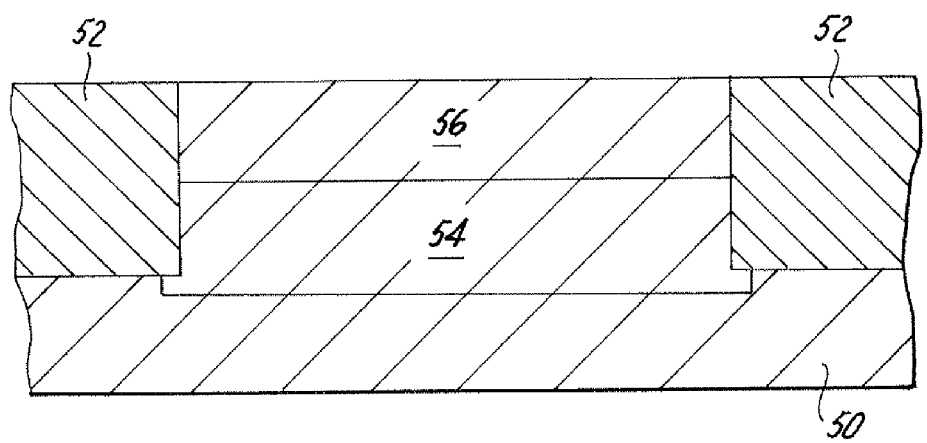
FIGS. 3–8 are pictorial representations of the inventive bipolar transistor through various processing steps of the present invention.

The method and various materials that are employed in forming the SiGe heterojunction bipolar transistor shown in FIG. 2 will now be described in more detail. Reference is first made to FIG. 3 which shows the bipolar device region of an initial structure that is employed in the present invention. The initial structure shown in FIG. 3 comprises substrate 50 having sub-collector region 54, collector region 56 and isolation regions 52 formed therein.

The structure shown in FIG. 3 is fabricated using conventional processing steps that are well known to those skilled in the art. Moreover, conventional materials are used in fabricating the same. For example, substrate 50 is composed of any semiconducting material including, but not limited to: Si, Ge, SiGe, GaAs, InAs, InP and all other III/V compound semiconductors. Layered substrates comprising the same or different semiconducting material, e.g., Si/Si or Si/SiGe, are also contemplated herein. Of these semiconducting materials, it is preferred that substrate 50 be composed of Si. As mentioned above, the substrate may be a N-type substrate or a P-type substrate depending on the type of device to be subsequently formed.

The structure of FIG. 3 is formed by first forming an oxide layer (not shown) on the surface of substrate 50 using a conventional deposition process such as chemical vapor deposition (CVD), plasma-assisted CVD, or sputtering, or alternatively the oxide layer is grown thermally. Sub-collector region 54 is then formed in the substrate using a conventional ion implantation step. After the implantation step, a thick oxide (also not shown), on the order of about 240 nm, is grown on the surface to eliminate implantation damage. Next, the thick oxide as well as the previously mentioned oxide layer are removed utilizing an etching process which has a high selectivity for removing oxide as compared to silicon.

Isolation regions 52 are then formed by either using a conventional local oxidation of silicon (LOCOS) process or by utilizing lithography, etching and trench isolation filling. It is noted that the drawings show the formation of isolation trench regions which are formed as follows: A patterned masking layer (not shown) is first formed on the surface of substrate 50 exposing portions of the substrate. Isolation trenches are then etched into the exposed portions of the substrate utilizing a conventional dry etching process such as reactive-ion etching (RIE) or plasma-etching. The trenches thus formed may be optionally lined with a conventional liner material, i.e., an oxide, and thereafter CVD or another like deposition process is employed to fill the trenches with silicon oxide or another like trench dielectric material. The trench dielectric material may optionally be densified after deposition and a conventional planarization process such as chemical-mechanical polishing (CMP) may also be optionally employed.

Following the formation of isolation regions in the substrate, collector region 56 is then formed in the bipolar device region (between the two isolation regions shown in FIG. 2) utilizing conventional ion implantation and activation annealing processes that are well known to those skilled in the art. The activation annealing process is typically carried out at a temperature of about 950° C. or above for a time of about 30 seconds or less.

At this point of the inventive process, the bipolar device region shown in the drawings may be protected by forming a protective material such as $Si_3N_4$ thereon, and conventional processing steps which are capable of forming adjacent device regions can be performed. After completion of the adjacent device regions and subsequent protection thereof, the inventive process continues. It should be noted that in some embodiments, the adjacent device regions are formed after completely fabricating the bipolar transistor.

Figure 4:
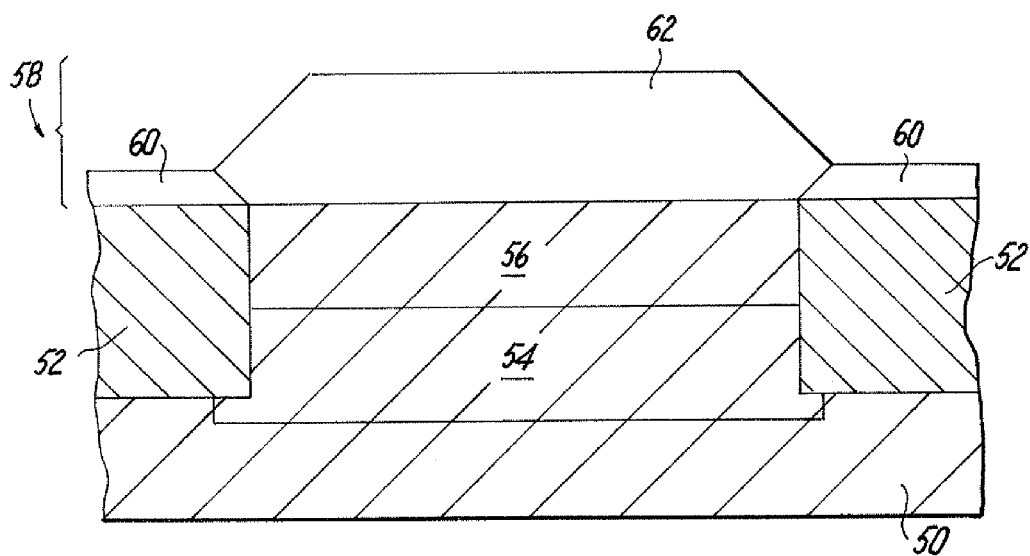

The next step of the present invention is shown in FIG. 4. In this figure, SiGe layer 58 is formed on substrate 50 as well as isolation regions 52. In accordance with the present invention, the SiGe layer includes polycrystalline Si regions 60 that are formed over isolation regions 52, and SiGe base region 62 which is formed over the collector and subcollector regions.

The SiGe layer is formed epitaxially utilizing any conventional deposition technique including, but not limited to: ultra-high vacuum chemical vapor deposition (UHVCVD; molecular beam epitaxy (MBE), rapid thermal chemical vapor deposition (RTCVD) and plasma-enhanced chemical vapor deposition (PECVD). The conditions used in forming the SiGe layer (which are conventional and well known to those skilled in the art) vary depending upon the desired technique employed.

Figure 5:
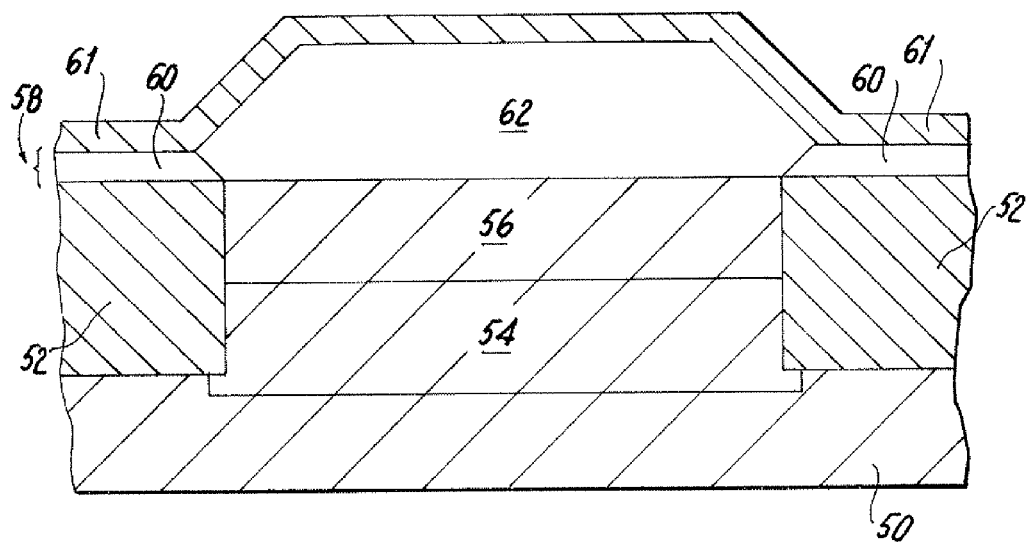

Next, and as shown in FIG. 5, insulator layer 61 (which will subsequently become patterned insulator 64) is formed on SiGe base layer 62 utilizing a conventional deposition process such as CVD, plasma-assisted CVD, chemical solution deposition and other like deposition processes. The insulator may be a single layer, as is shown in FIG. 5, or it may contain multi-insulator layers. The insulator layer is composed of the same or different insulator material which is selected from the group consisting of $SiO_2$, Si oxynitride and other like insulators.

Figure 6:
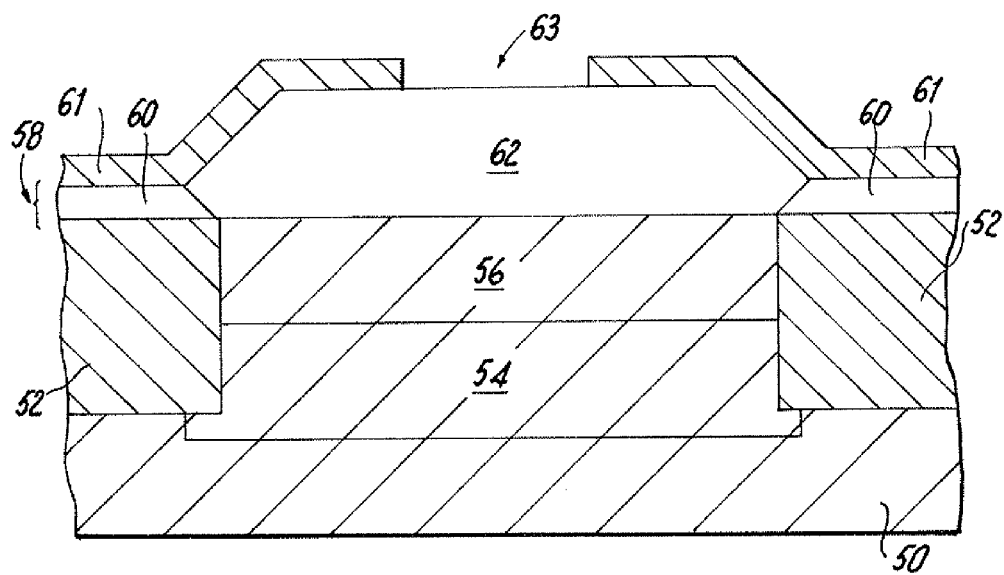

Emitter window opening 63 is then formed in insulator layer 61 so as to expose a portion of the SiGe base region, See FIG. 6. The emitter window opening is formed utilizing lithography and etching. The etching step used is selective in removing the insulator material as compared to the SiGe layer.

Figure 7:
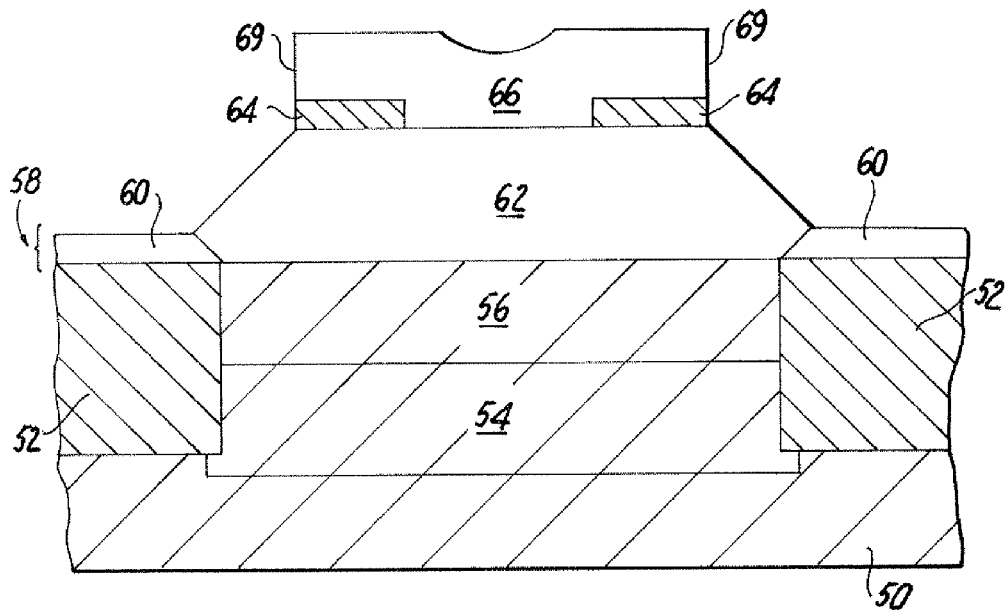

Following formation of the emitter window opening, an intrinsic polysilicon layer (which will subsequently become emitter 66) is formed on the patterned insulator and in the emitter window opening by utilizing either a conventional in-situ doping deposition process or deposition followed by ion implantation. The polysilicon and the insulator are then selectively removed so as to form patterned insulator 64 and emitter 66 on SiGe base region 62, See FIG. 7. Specifically, lithography and etching are employed in forming the structure shown in FIG. 7. It is should be noted that a single etching process may be employed in removing portions of the intrinsic polysilicon layer and insulator layer 61, or separate etching steps may be employed in removing these layers. It is noted that in the structure shown in FIG. 7, emitter 66 has exposed sidewalls 69.

Figure 8:
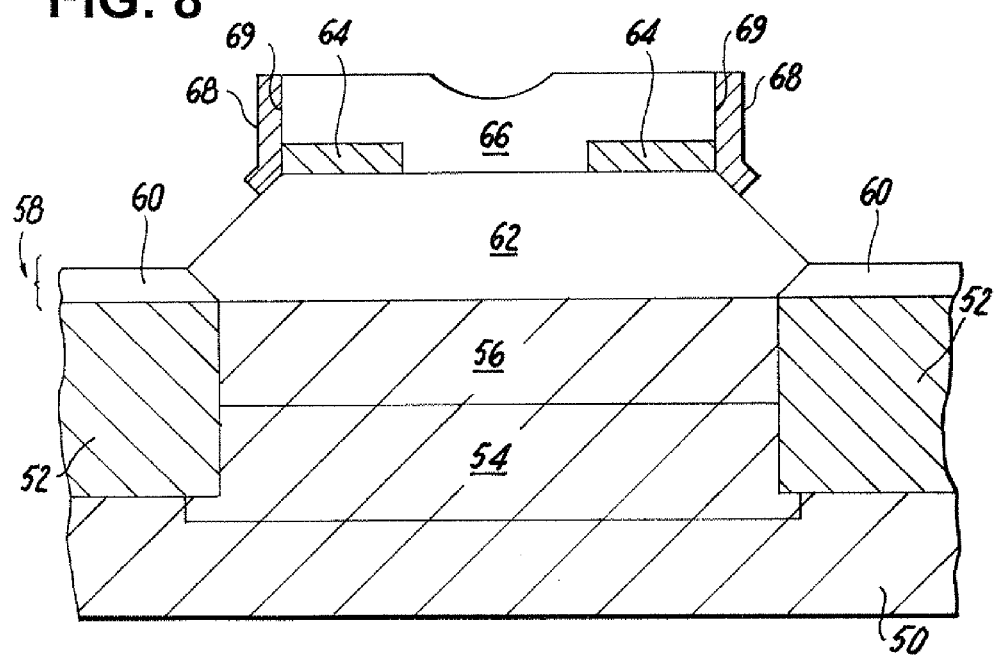

Next, as shown in FIG. 8, conformal passivation layer 68 is formed on exposed sidewalls 69 of emitter 68 as well as on the vertical sidewalls of patterned insulator 64 and a portion of SiGe base region 62. In accordance with the present invention the conformal passivation layer is formed utilizing a rapid thermal chemical vapor deposition (RTCVD) process. The passivation layer may be composed of an oxide, an oxynitride, a nitride, or any combination thereof. Of these materials, it is preferred in the present invention that a nitride passivation layer be employed. When a nitride passivation layer is to be formed, the nitride passivation layer is formed by a RTCVD process that is carried out in a nitrogen-containing atmosphere such as NO, $N_2O$ or $N_2$, at a temperature of about 700° C. or higher.

The passivation layer can then be selectively removed using an anisotropic RIE process. This will leave sidewalls protecting the emitter edges and a complete protecting layer over other regions intentionally left passivated via a lithographic process.

Following the passivation of the exposed sidewalls of emitter 66, the structure shown in FIG. 8 is subjected to a conventional silicidation process which is capable of forming silicide regions 70 in the structure. Specifically, the silicide regions are formed in portions of SiGe layer 58 that are not protected by the passivation layer. This step of the present invention results in the formation of the structure shown in FIG. 2; note in FIG. 2, no bridging between adjacent silicide regions, as is the case in FIG. 1, is observed.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim is new and desire to secure by the Letters Patent is:

1. A method of fabricating a SiGe heterojunction bipolar transistor comprising the steps of:

providing a heterojunction bipolar transistor structure comprising at least an underlying SiGe base region, an insulator layer formed on surface portions of said underlying SiGe base region, and an emitter formed on said insulator layer and in contact with said underlying SiGe base region through an emitter opening formed in said insulator layer, said emitter, said insulator layer and said SiGe base region each having exposed sidewalls;

forming a permanent passivation layer on said exposed sidewalls of said emitter, said insulator layer and portions of said SiGe base region; and siliciding exposed silicon surfaces of at least said emitter and said SiGe base region not protected by said permanent passivation layer to form silicide regions therein, wherein said permanent passivation layer prevents bridging between silicide regions thereby substantially eliminating shorts and improving bipolar yield by as much as 20–30%.

2. The method of claim 1 wherein said passivation layer is formed from a rapid thermal chemical vapor deposition process.

3. The method of claim 1 wherein said passivation layer is composed of a nitride, an oxide, an oxynitride or any combination thereof.

4. The method of claim 1 wherein said passivation layer is a nitride passivation layer.

5. The method of claim 4 wherein said nitride passivation layer is formed from a rapid thermal chemical vapor deposition process which is carried out in a nitrogen-containing atmosphere.

6. The method of claim 5 wherein said nitrogen-containing atmosphere is selected from the group consisting of NO, $N_2O$ and $N_2$.

7. The method of claim 2 wherein said rapid thermal chemical vapor deposition process is carried out at a temperature of about 700° C. or greater.

8. The method of claim 1 wherein said SiGe base region is formed by a deposition process selected from the group consisting of ultra-high vacuum chemical vapor deposition (UHVCVD), molecular beam epitaxy (MBE), rapid thermal chemical vapor deposition (RTCVD) and plasma-enhanced chemical vapor deposition.

9. A SiGe heterojunction bipolar transistor comprising:
a semiconductor substrate having a collector and subcollector region located therein, wherein said collector is located between isolation regions that are also present in the substrate;
a SiGe layer atop said substrate, said SiGe layer including polycrystalline Si regions positioned, above said isolation regions and a SiGe base region located above said collector and subcollector regions;
a patterned insulator layer atop said SiGe base region, said patterned insulator having an opening therein;
an emitter located on said patterned insulator layer and in contact with said SiGe base region through said opening, said emitter, said patterned insulator layer and said SiGe base region each having exposed sidewalls;
a permanent conformal passivation layer positioned on said exposed sidewalls of said emitter, said patterned insulator layer and a portion of said SiGe base region; and
silicide regions located on exposed portions of said SiGe layer, including portions of said SiGe base region, and said emitter not covered by said permanent conformal passivation layer, wherein said permanent passivation layer prevents bridging between silicide regions thereby substantially eliminating shorts and improving bipolar yield by as much as 20–30%.

10. The SiGe heterojunction bipolar transistor of claim 9 wherein said semiconductor substrate is selected from the group consisting of Si, Ge, SiGe, GaAs, InAs, InP, other III/V compound semiconductors, Si/Si and Si/SiGe.

11. The SiGe heterojunction bipolar transistor of claim 9 wherein said emitter is composed of intrinsic polysilicon.

12. The SiGe heterojunction bipolar transistor of claim 9 wherein said patterned insulator is composed of $SiO_2$ or Si oxynitride.

13. The SiGe heterojunction bipolar transistor of claim 9 wherein said patterned insulator is composed of multi-insulator layers.

14. The SiGe heterojunction bipolar transistor of claim 9 wherein said passivation layer is also formed on vertical sidewalls of said patterned insulator and portions of said SiGe base region.

15. The SiGe heterojunction bipolar transistor of claim 9 wherein said silicide regions are formed in an exposed horizontal surface of said emitter, said polycrystalline Si region and a portion of said SiGe base region.

16. The SiGe heterojunction bipolar transistor of claim 9 wherein said passivation layer is composed of a nitride, an oxide, an oxynitride or any combination thereof.

17. The SiGe heterojunction bipolar transistor of claim 9 wherein said passivation layer is a nitride passivation layer.

18. A SiGe heterojunction bipolar transistor comprising:
a semiconductor substrate having a collector and subcollector region located therein, wherein said collector is located between isolation regions that are also present in the substrate;
a SiGe layer atop said substrate, said SiGe layer including polycrystalline Si regions positioned above said isolation regions and a SiGe base region located above said collector and subcollector regions;
a patterned insulator layer atop said SiGe base region, said patterned insulator having an opening therein;
an emitter located on said patterned insulator layer and in contact with said SiGe base region through said opening, said emitter, said patterned insulator layer and said SiGe base region each having exposed sidewalls; a permanent conformal passivation layer positioned on said exposed sidewalls of said emitter, said patterned insulator layer and an inclined portion of said SiGe base region; and
silicide regions located on exposed portions of said SiGe layer, including portions of said SiGe base region, and said emitter not covered by said permanent conformal passivation layer, wherein said permanent passivation layer prevents bridging between silicide regions thereby substantially eliminating shorts and improving bipolar yield by as much as 20–30%.

* * * * *